(12) United States Patent
Gandhi et al.

(10) Patent No.: US 10,651,155 B2
(45) Date of Patent: May 12, 2020

(54) THERMAL PADS BETWEEN STACKED SEMICONDUCTOR DIES AND ASSOCIATED SYSTEMS AND METHODS

(71) Applicant: Micron Technology, Inc., Boise, ID (US)

(72) Inventors: Jaspreet S. Gandhi, San Jose, CA (US); Michel Koopmans, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/122,280

(22) Filed: Sep. 5, 2018

(65) Prior Publication Data

US 2019/0006323 A1 Jan. 3, 2019

Related U.S. Application Data

(60) Continuation of application No. 15/683,336, filed on Aug. 22, 2017, now Pat. No. 10,096,579, which is a
(Continued)

(51) Int. Cl.
*H01L 25/065* (2006.01)
*H01L 25/00* (2006.01)
(Continued)

(52) U.S. Cl.
CPC .... *H01L 25/0657* (2013.01); *H01L 21/76898* (2013.01); *H01L 23/3677* (2013.01); *H01L 23/481* (2013.01); *H01L 24/03* (2013.01); *H01L 24/06* (2013.01); *H01L 24/13* (2013.01); *H01L 24/14* (2013.01); *H01L 24/16* (2013.01); *H01L 24/17* (2013.01); *H01L 25/50* (2013.01); *H01L 2224/0401* (2013.01); *H01L 2224/05025* (2013.01); *H01L 2224/05147* (2013.01); *H01L 2224/06102* (2013.01); *H01L 2224/06519* (2013.01); *H01L 2224/13009* (2013.01); *H01L 2224/13021* (2013.01); *H01L 2224/13025* (2013.01); *H01L 2224/141* (2013.01); *H01L 2224/1403* (2013.01); *H01L 2224/16145* (2013.01); *H01L 2224/16146* (2013.01);
(Continued)

(58) Field of Classification Search
CPC ............ H01L 25/0657; H01L 21/76898
USPC .................................... 257/611, 612
See application file for complete search history.

(56) References Cited

U.S. PATENT DOCUMENTS 5,424,245 A 6/1995 Gurtler et al.
5,528,080 A 6/1996 Goldstein
(Continued)

*Primary Examiner* — Lex H Malsawma
*Assistant Examiner* — Eric W Jones
(74) *Attorney, Agent, or Firm* — Perkins Coie LLP

(57) ABSTRACT

Systems and methods are described for improved heat dissipation of the stacked semiconductor dies by including metallic thermal pads between the dies in the stack. In one embodiment, the thermal pads may be in direct contact with the semiconductor dies. Heat dissipation of the semiconductor die stack can be improved by a relatively high thermal conductivity of the thermal pads that directly contact the adjacent silicon dies in the stack without the intervening layers of the low thermal conductivity materials (e.g., passivation materials). In some embodiments, the manufacturing yield of the stack can be improved by having generally coplanar top surfaces of the thermal pads and under-bump metallization (UBM) structures.

23 Claims, 9 Drawing Sheets

Related U.S. Application Data division of application No. 14/171,169, filed on Feb. 3, 2014, now Pat. No. 9,768,147.

(51) Int. Cl.
  *H01L 23/00* (2006.01)
  *H01L 23/367* (2006.01)
  *H01L 23/48* (2006.01)
  *H01L 21/768* (2006.01)

(52) U.S. Cl.
  CPC ............... *H01L 2224/17519* (2013.01); *H01L 2225/06513* (2013.01); *H01L 2225/06541* (2013.01); *H01L 2225/06589* (2013.01); *H01L 2924/01022* (2013.01); *H01L 2924/01074* (2013.01); *H01L 2924/07025* (2013.01); *H01L 2924/10253* (2013.01)

(56) References Cited

U.S. PATENT DOCUMENTS

| | | | |
|---|---|---|---|
| 7,109,068 B2 | 9/2006 | Akram et al. | |
| 7,179,740 B1 | 2/2007 | Hsuan | |
| 7,387,949 B2 | 6/2008 | Fukazawa | |
| 7,786,573 B2 | 8/2010 | Choi et al. | |
| 8,030,780 B2 | 10/2011 | Kirby et al. | |
| 8,159,065 B2 | 4/2012 | Suh et al. | |
| 8,395,057 B2 | 3/2013 | Rangsten et al. | |
| 8,614,145 B2 | 12/2013 | Hummler et al. | |
| 8,900,994 B2 * | 12/2014 | Yu | H01L 24/05 438/667 |
| 9,768,147 B2 | 9/2017 | Gandhi et al. | |
| 2004/0259325 A1 | 12/2004 | Gan | |
| 2007/0045836 A1 | 3/2007 | Kwon et al. | |
| 2008/0136023 A1 * | 6/2008 | Komai | H01L 21/76898 257/737 |
| 2009/0160050 A1 | 6/2009 | Miyakawa et al. | |
| 2009/0283898 A1 | 11/2009 | Janzen et al. | |
| 2010/0171197 A1 | 7/2010 | Chang et al. | |
| 2010/0330798 A1 | 12/2010 | Huang et al. | |
| 2011/0291265 A1 | 12/2011 | Jin et al. | |
| 2012/0074579 A1 * | 3/2012 | Su | H01L 21/76898 257/774 |
| 2013/0105968 A1 * | 5/2013 | Lu | H01L 21/76898 257/737 |
| 2013/0157436 A1 | 6/2013 | Hummler et al. | |
| 2013/0168740 A1 | 7/2013 | Chen et al. | |
| 2013/0193527 A1 | 8/2013 | Chu et al. | |
| 2013/0299950 A1 * | 11/2013 | Hummler | H01L 23/3677 257/622 |
| 2014/0027920 A1 | 1/2014 | Kodama et al. | |
| 2014/0197541 A1 | 7/2014 | Stephens et al. | |
| 2014/0239457 A1 | 8/2014 | Daubenspeck et al. | |
| 2015/0221612 A1 | 8/2015 | Gandhi et al. | |
| 2017/0352645 A1 | 12/2017 | Gandhi et al. | |

* cited by examiner

THERMAL PADS BETWEEN STACKED SEMICONDUCTOR DIES AND ASSOCIATED SYSTEMS AND METHODS

CROSS-REFERENCE TO RELATED APPLICATIONS

This application is a continuation of U.S. application Ser. No. 15/683,336, filed Aug. 22, 2017; which is a divisional of U.S. application Ser. No. 14/171,169, filed Feb. 3, 2014, now U.S. Pat. No. 9,768,147; each of which is incorporated herein by reference in its entirety.

TECHNICAL FIELD

The present technology generally relates to stacked semiconductor dies having through-silicon vias (TSVs). Several embodiments of the present technology are related to improving heat dissipation of the stacked semiconductor dies by including metallic thermal pads between the dies in the stack.

BACKGROUND

Stacked semiconductor dies are used in a wide variety of applications that require high data transfer rates and/or small footprints. For example, many systems require a processor die (e.g., logic die) and one or more memory dies. Traditionally, the processor and memory dies are packaged in separate packages and are electrically interconnected through a motherboard. In some applications, the processor and memory dies are placed next to each other on a common packaging substrate that provides electrical connectivity between the processor and memory dies. Nonetheless, in such applications a relatively large distance from one die to another limits the data transfer rates among the dies. The data transfer rates are additionally limited by the capacitance and inductance of the traces that electrically interconnect the dies. Furthermore, each die (e.g., a processor or a memory die) occupies space on the substrate in proportion to its size and to the corresponding traces that connect the die to other dies, such that side-by-side configurations have larger overall footprints.

For applications that require higher data transfer rates and/or smaller packages, a processor and several memory dies can be stacked vertically and electrically interconnected using TSVs. The TSVs enable stacked dies to be stacked close to each other such that the dies are spaced apart from each other by only relatively small vertical distances, which in combination with the relatively low inductance of the TSVs enables higher data transfer rates. Also, since the dies are stacked vertically, the total footprint of the stack corresponds to the footprint of the largest die in the stack.

FIG. 1 is a partially schematic cross-sectional view of a vertically stacked die arrangement in accordance with the prior art. As shown in FIG. 1, a stacked die assembly 1000 has a processor die 110, three memory dies 120a-c stacked on the processor die 110, and TSVs 150 that electrically connect the processor die 110 with the memory dies 120a-c. The processor die 110 can have several functional areas, for example a processor core 116, read/write logic 117 and/or I/O buffer 118. These functional areas can be electrically interconnected through metallization traces 119. The processor die 110 also includes pads 115 for electrically connecting the stacked die assembly 1000 to a package substrate (not shown) through, for example, wirebonds. The closely spaced, vertically stacked dies 110 and 120a-c are suitable for relatively high data transfer rates while occupying only a relatively small total area. However, the close spacing of the semiconductor dies also increases the density of power dissipated by the semiconductor dies. Therefore, thermal management is typically more difficult for stacked semiconductor dies than for other arrangements. One possible improvement in the thermal management of the stacked semiconductor dies includes placing thermal pads (dummy pads, outrigger pads) between the dies in the stack to enhance heat transfer through and ultimately out of the stack.

FIGS. 2A-2G illustrate a manufacturing process for thermal pads of a semiconductor die stack in accordance with the prior art. FIG. 2A illustrates a semiconductor die 201 attached to a carrier wafer 225 by an adhesive 220. The carrier wafer 225 can be used to improve handling and to protect the semiconductor dies during the manufacturing process. Suitable carrier materials are, for example, ceramic or silicon. In a typical semiconductor manufacturing process, the carrier wafer will be removed from the semiconductor dies before packaging the individual semiconductor dies. The semiconductor die 201 can have a silicon material 210, an active structure 215 that includes electrical circuits, and TSVs 230 interconnecting the electrical circuits of the active structure 215 to an area at a peripheral surface 211 of the silicon material 210. As explained in relation to FIG. 2G below, the peripheral surface 211 faces additional die or dies in the stack. The die 210 can also have an isolation lining 235 (FIGS. 2A-2C) that electrically isolates a conductive material 231 of the TSV 230 from the silicon material 210. Only one TSV 230 is shown in FIG. 2A for clarity, but a typical semiconductor die would include many TSVs.

FIG. 2B illustrates the semiconductor die 201 after planarizing or grinding the peripheral surface 211. This can thin the die and roughen the peripheral surface 211, which improves adhesion of mask layers used in subsequent processing steps.

FIG. 2C illustrates the semiconductor die 201 after the peripheral surface 211 has been etched to expose one end portion of the TSV 230. Suitable silicon etching techniques include, for example, selectively etching silicon while not etching metals, for example copper. After etching, a portion of the TSV 230 projects above the peripheral surface 211 of the semiconductor die 201.

FIGS. 2D and 2E illustrate the semiconductor die 201 with a passivation material 280 before and after patterning, respectively. The passivation material 280 can be a polymer, for example, a polyimide. Suitable patterning techniques include, for example, photo patterning and developing a resist material to etch indentations 285 in the passivation material 280. For example, a leaky chrome process can be used to pattern the indentations 285. The indentations 285 in the passivation material 280 provide locations for subsequent metal deposition. For example, sputtering techniques can be used to deposit metal into the indentations 285.

FIG. 2F illustrates the semiconductor die 201 after depositing metal into the indentations 285 to form thermal pads 250 and an under-bump metallization (UBM) structure 255. The thermal pads 250 and UBM structure 255 are formed during the same metal deposition process. The thermal pads 250 have a relatively high thermal conductivity that improves heat dissipation from the semiconductor die 201 when the thermal pads 250 contact the next semiconductor die in the stack. The thermal pads 250 transfer heat through the stack and ultimately to the environment. The UBM structure 255 that caps the exposed end of the TSV 230 electrically connects signal, power and/or ground lines with other semiconductor dies in the stack. With the conventional technology, the thermal pads 250 are formed over a thin portion of the passivation material 280 that separates the thermal pads 250 from the silicon material 210 by a thickness T. Additionally, since the thermal pads 250 and UBM structure 255 are formed in a same semiconductor manufacturing step (e.g., metal deposition), approximately same thickness of material is added to the target areas of the semiconductor die corresponding to the pattern of indentations 285. As such, after forming the UBM structures 255 and the thermal pads 250, the top of the UBM structure 255 may be higher than the top of the thermal pad. For example, the top of the UBM structure 255 may be separated from the top of the thermal pad 250 by a distance L.

FIG. 2G illustrates stacking of the semiconductor dies 201 and 202 stacked after the carrier wafer 225 and adhesive 220 have been removed. The semiconductor dies 201 and 202 are aligned such that the TSV 230 of the semiconductor die 201 connects to a TSV 232 of the semiconductor die 202 through a die pad 270 when the semiconductor dies are brought into contact in a direction of arrows 251. The thermal pads 250 help to transfer heat Q from the stack in addition to the heat transferred through the TSV 230. The illustrated conventional thermal pads 250, however, suffer from several deficiencies. For example, the passivation material 280 (e.g., a polymer) has a relatively low thermal conductivity that inhibits heat transfer from the semiconductor die 202 in proportion to a thickness T of the passivation material that separates the thermal pads 250 from the silicon material 210. Furthermore, the uneven height (e.g., distance L) of the UBM structure 255 and the thermal pads 250 generally reduces the stacking yield of the semiconductor dies because contact between the UBM structure 255 and the die pad 270 can prevent the thermal pads 250 from contacting the semiconductor die 202.

BRIEF DESCRIPTION OF THE DRAWINGS

Many aspects of the present technology can be better understood with reference to the following drawings. The components in the drawings are not necessarily to scale. Instead, emphasis is placed on clearly illustrating the principles of the present technology. Furthermore, like reference numerals designate corresponding parts throughout the several views.

DETAILED DESCRIPTION

Specific details of several embodiments of representative stacked die assemblies and associated methods of manufacturing stacked die assemblies are described below. The stacked die assemblies may include vertical stacks of memory dies, processor dies, and/or other dies that are electrically interconnected using through-substrate vias (TSVs). A person skilled in the relevant art will also understand that the technology may have additional embodiments, and that the technology may be practiced without several of the details of the embodiments described below with reference to FIGS. 3A-5.

Several embodiments of the present technology are directed to vertically stacked semiconductor dies with improved heat dissipation and manufacturing yield when compared to the conventional devices described above with reference to FIGS. 2A-2G. In some embodiments of the present technology, thermal pads can contact the adjacent silicon dies in the stack to improve heat transfer through the semiconductor die stack. For example, thermal pads having a relatively high thermal conductivity can directly contact the adjacent silicon dies in the stack without the intervening layers of the low thermal conductivity materials (e.g., passivation materials). Furthermore, in some embodiments of the present technology, the thermal pads and UBM structures of a semiconductor die can have generally coplanar top surfaces to improve adhesion of the thermal pads and UBM structures with the next die of the stack and thereby improve the overall die stacking yield (e.g., manufacturing yield).

Figure 1:
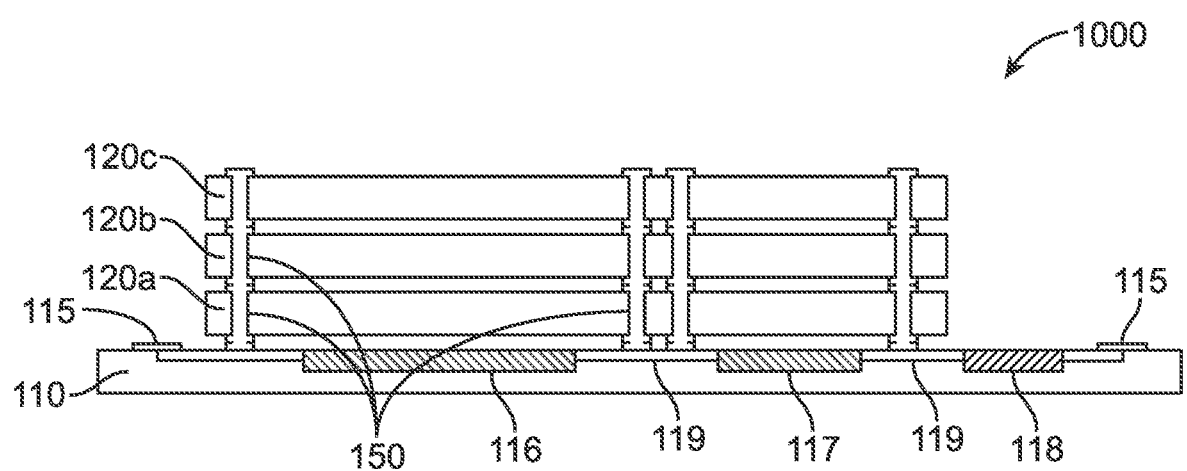
FIG. 1 is a partially schematic cross-sectional view of vertically stacked dies in accordance with the prior art.
Figure 2A:
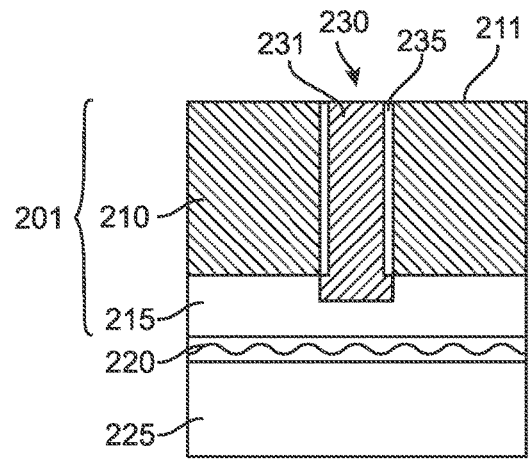
FIGS. 2A-2G illustrate a manufacturing process for forming thermal pads of a semiconductor die stack in accordance with the prior art.
Figure 2B:
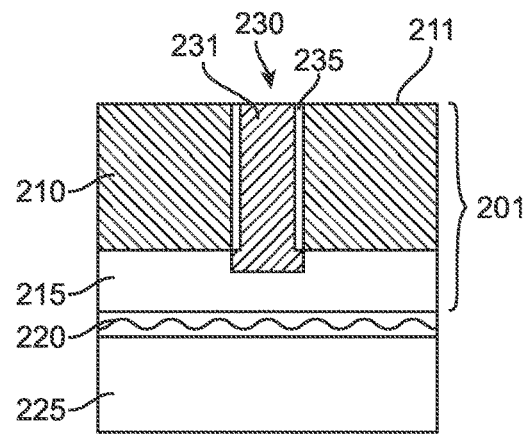
Figure 2C:
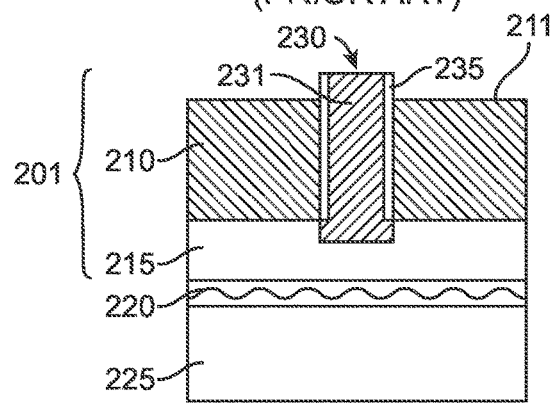
Figure 2D:
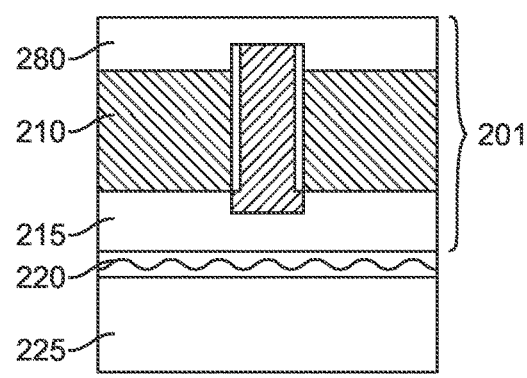
Figure 2E:
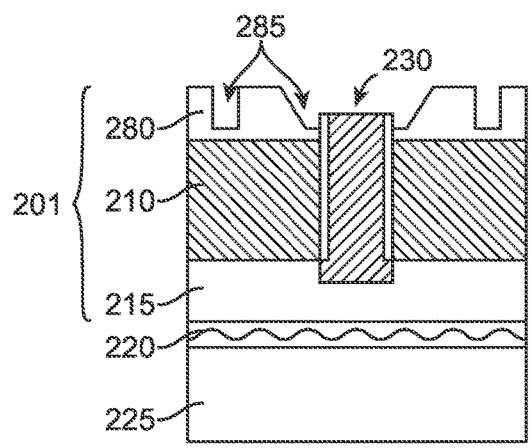
Figure 2F:
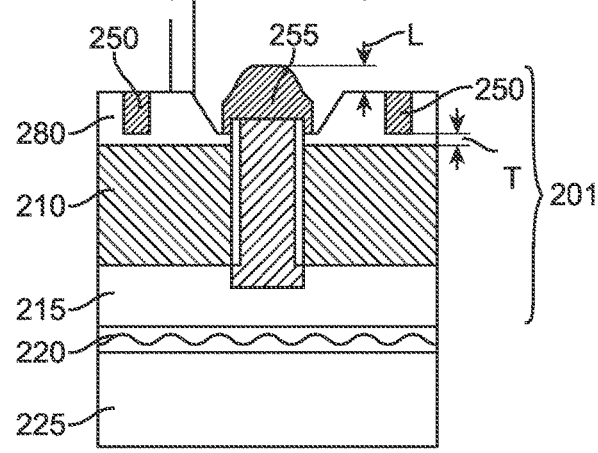
Figure 2G:
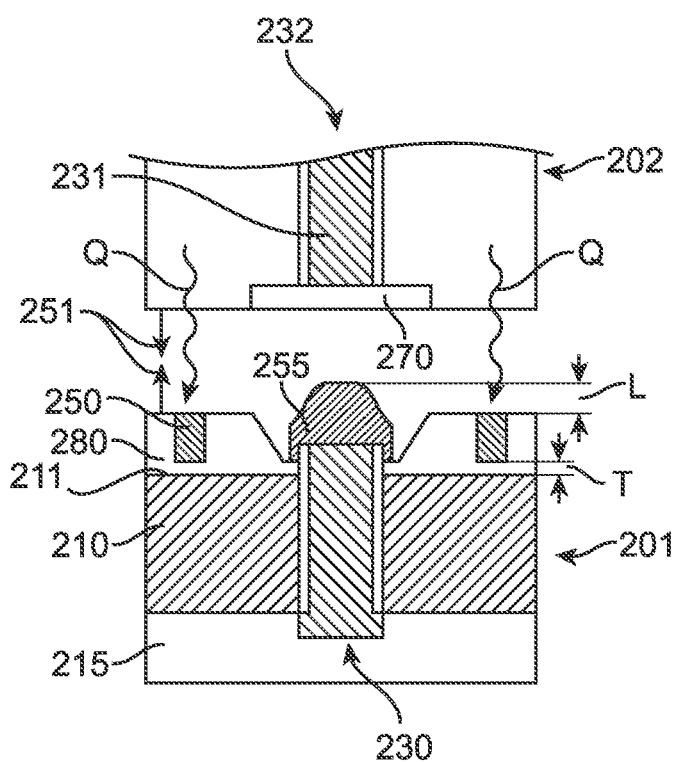
Figure 3A:
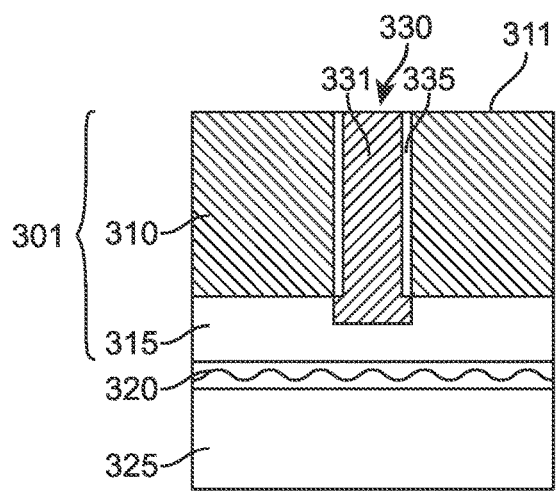
FIGS. 3A-3I illustrate a manufacturing process for forming thermal pads of a semiconductor die stack in accordance with an embodiment of the present technology.

FIGS. 3A-3I illustrate a manufacturing process for forming thermal pads of a semiconductor die stack in accordance with an embodiment of the present technology. FIG. 3A illustrates a semiconductor die 301 having a silicon material 310 with a peripheral surface 311 and an active structure 315. The semiconductor die 301 can be attached to a carrier wafer 325 by an adhesive 320. In some embodiments, the carrier wafer 325 can be used for improved handling and protection of the semiconductor dies during the manufacturing process, and the carrier wafer 325 can be removed from the semiconductor die 301 before packaging the individual semiconductor dies in a stack. The die 301 can also include a plurality of TSVs 330 (only one shown) that electrically connect integrated circuits of the active structure 315 with other semiconductor dies in the stack, and each TSV 330 can have a conductive material 331 and an isolation lining 335 that electrically isolates the conductive material 331 from the silicon material 310.

Figure 3B:
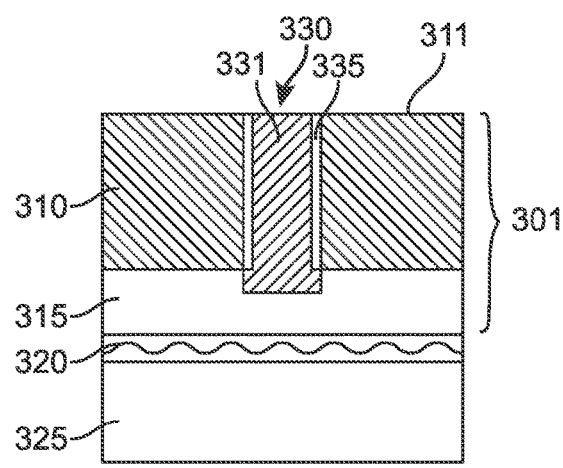

FIG. 3B illustrates the semiconductor die 301 after planarizing the peripheral surface 311 and the top of the TSV 330. The planarization thins the die to reduce the overall height of the die stack. Additionally, the planarization can roughen the peripheral surface 311 to improve adhesion of the mask layers and metallization of the subsequent manufacturing steps. Suitable planarization and grinding techniques include, for example, chemical-mechanical planarization and mechanical grinding.

Figure 3C:
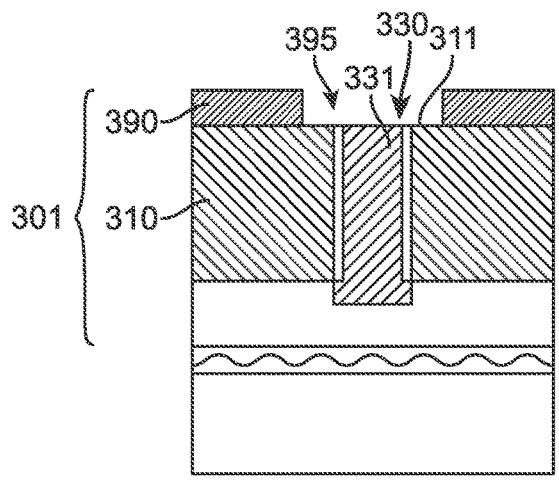

FIG. 3C illustrates the semiconductor die 301 after applying a mask 390 over the peripheral surface 311 and forming an opening 395 in the mask 390 aligned with the TSV 330. The opening 395 exposes the TSV 330 and a portion of the peripheral surface 311 around the TSV 330 (e.g., laterally from the TSV 330). In some embodiments, the exposed portion of the peripheral surface 311 can be etched while the remaining areas of the peripheral surface 311 covered by the mask 390 are protected from the etchant.

Figure 3D:
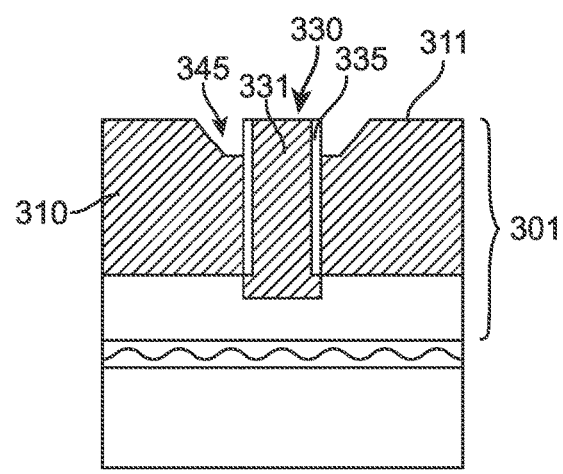

FIG. 3D illustrates the semiconductor die 301 after the silicon material 310 around the TSV 330 has been etched to form an indentation 345. Suitable silicon etchants can selectively etch the silicon material 310 while not etching the conductive material 331 of the TSV 330 or at least etching the conductive material 331 at a slower rate than that of the silicon material 310. A non-isotropic etchant can create inclined surfaces of the indentation 345, but isotropic etchants can also be used. After etching a portion of the silicon material 310 around the TSV 330, the TSV 330 projects above the floor of the indentation 345. In some embodiments of the present technology, the exposed end of the TSV 330 can be generally co-planar with the areas of peripheral surface 311 covered by the mask 390 (FIG. 3C), which can promote a generally uniform height of a subsequently deposited metal material as explained in more detail with reference to FIGS. 3G and 3H below.

Figure 3E:
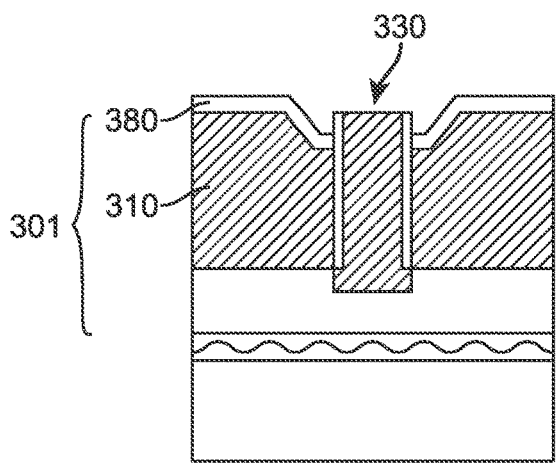
Figure 3F:
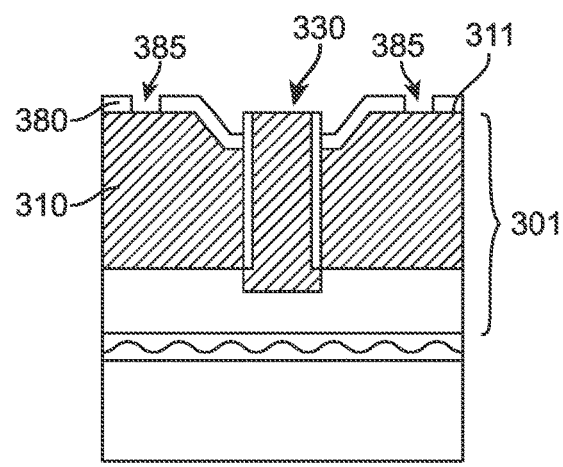

FIGS. 3E and 3F illustrate the semiconductor die 301 after a passivation material 380 has been deposited (FIG. 3E) and then patterned (FIG. 3F). The passivation material 380 covers the peripheral surface 311 of the semiconductor die 301, but does not cover the top of the TSV 330. Suitable passivation materials may include polyimide or nitrogen oxide. In some embodiments, the passivation material can have a thickness of about 2 µm. After patterning, the passivation material 380 has openings 385 (FIG. 3F) that expose locations for metal deposition on or otherwise at the peripheral surface 311.

Figure 3G:
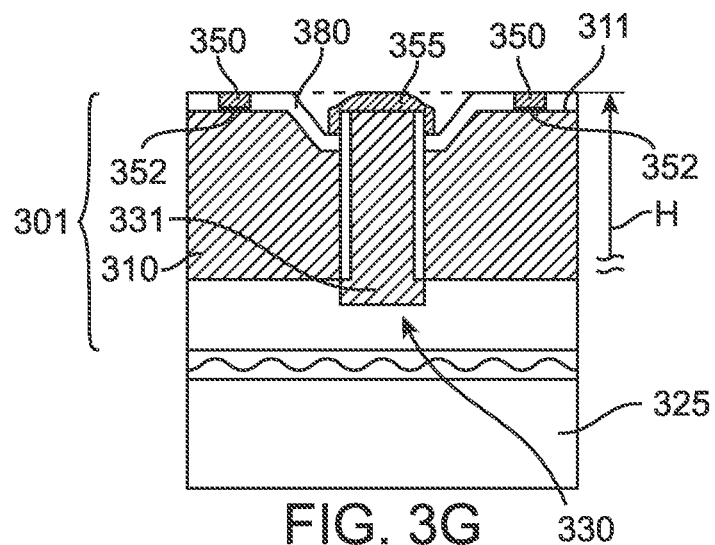
Figure 3H:
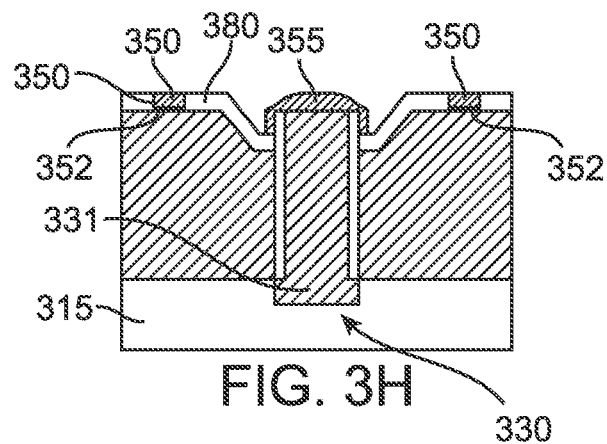

FIG. 3G illustrates the semiconductor die 301 after thermal pads 350 and UBM structures 355 (only one shown) have been formed. The thermal pads 350 can be formed by depositing metal into the openings 385, and the UBM structure 355 can be formed by depositing metal over the exposed end of the TSV 330. In some embodiments, sputtering techniques can be used to deposit metal into the openings and over the exposed end of the TSV 330 in a single process. In some embodiments an adhesion material 352 (e.g., Ti and/or TiW) may be deposited into the indentations 385 to securely adhere the thermal pads 350 to the silicon material 310. In at least some embodiments, the top surfaces of the UBM structure 355 and the thermal pads 350 are generally coplanar (e.g., at generally the same height (H)) because the exposed end of the TSV 330 and the peripheral surface 311 are at least substantially coplanar at the onset of the metal deposition process. FIG. 3H shows the semiconductor die 310 after the carrier wafer 325 has been removed. As explained in more detail with reference to FIG. 3I below, coplanarity between the tops of the thermal pads 350 and UBM structures 355 can improve attachment of the semiconductor die 301 to the next semiconductor die in the stack.

Figure 3I:
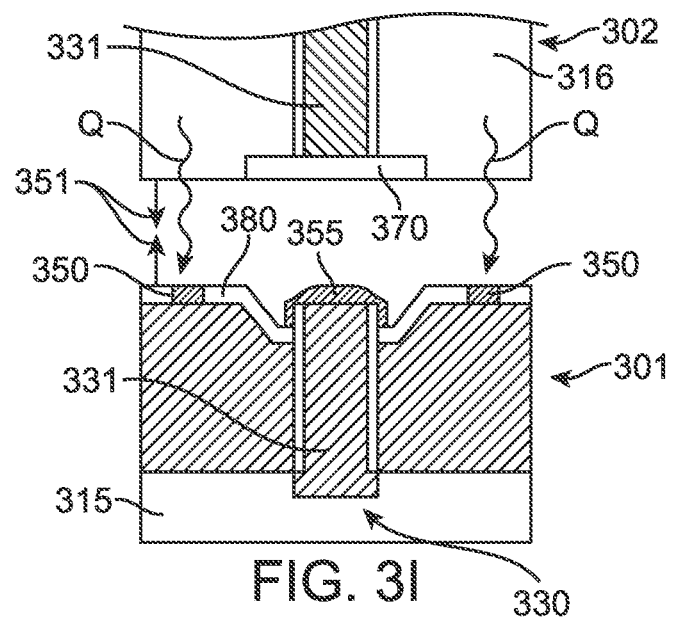

FIG. 3I illustrates stacking of the semiconductor dies 301 and 302. In some embodiments of the present technology, the UBM structure 355 of the semiconductor die 301 can be aligned with a corresponding die pad 370 of the semiconductor die 302. When the semiconductor dies 301 and 302 are stacked (arrows 351), the thermal pads 350 of the semiconductor die 301 contact an active structure 316 of the semiconductor die 302, and the UBM structure 355 contacts the die pad 370. In operation, heat transfer (Q) between the dies 301, 302 (and ultimately away from the stack) can be improved by a relatively high thermal conductivity of the thermal pads 350 that directly contact semiconductor dies 301 and 302. In some embodiments, the thermal pads 350 can be formed of copper, aluminum and/or other metals. Furthermore, since the top surfaces of the thermal pads 350 and UBM structure 355 are at least substantially coplanar, the stacking yields of the semiconductor dies can be improved because of better alignment of the thermal pads 350 and UBM structure 355 with the corresponding structures of the semiconductor die 302. Additional semiconductor dies (not shown) can also be added to the stack. For example, the stack can include 4, 8, 10, or more semiconductor dies.

Figure 4A:
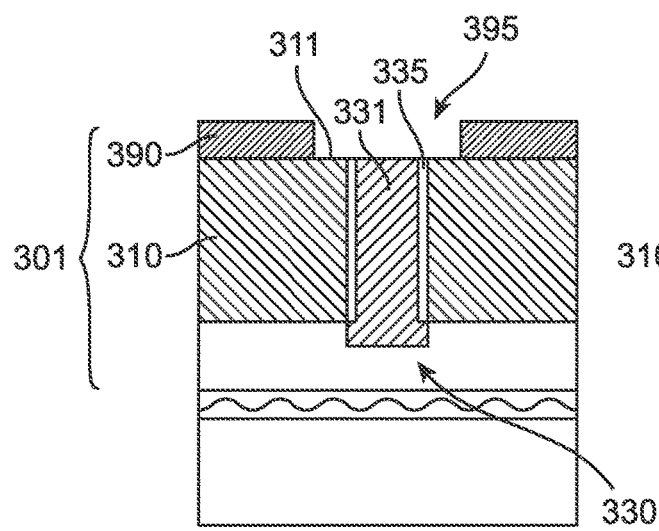
FIGS. 4A-4G illustrate a manufacturing process for forming thermal pads of a semiconductor die stack in accordance with another embodiment of the present technology.

FIGS. 4A-4G illustrate a manufacturing process for forming thermal pads of a semiconductor die stack in accordance with an additional embodiment of the present technology. FIG. 4A corresponds to FIG. 3C described above, and like reference number refer to the same or similar components in FIGS. 3A-4G.

Figure 4B:
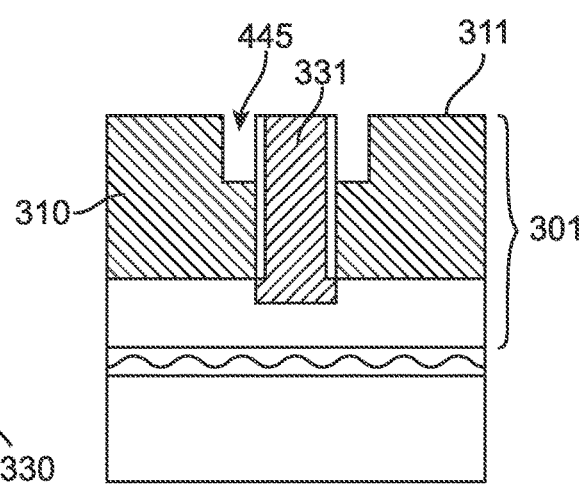

FIG. 4B illustrates the semiconductor die 301 after etching the exposed portion of the peripheral surface 311 to form an indentation 445 in the semiconductor material 310 around the exposed end of the TSV 330. In the embodiment shown in FIG. 4B, the indentation 445 is formed using an isotropic etchant that forms generally vertical walls in the silicon material 310, but non-isotropic etchants can also be used. Additionally, the etchant can selectively remove the silicon material 310 such that the TSV 330 remains substantially unchanged by etching. Therefore, the TSV 330 can have a top surface that is generally coplanar with the peripheral surface 311 of the silicon material 310.

Figure 4C:
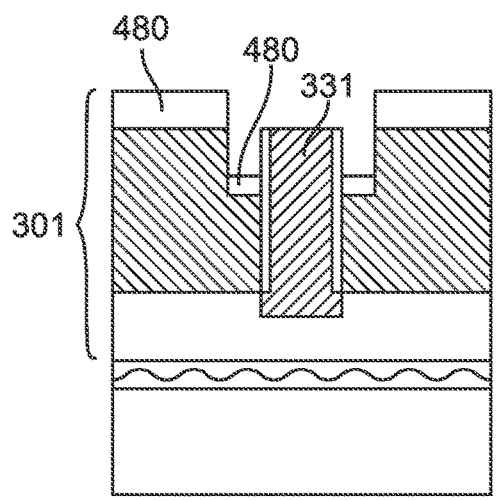
Figure 4D:
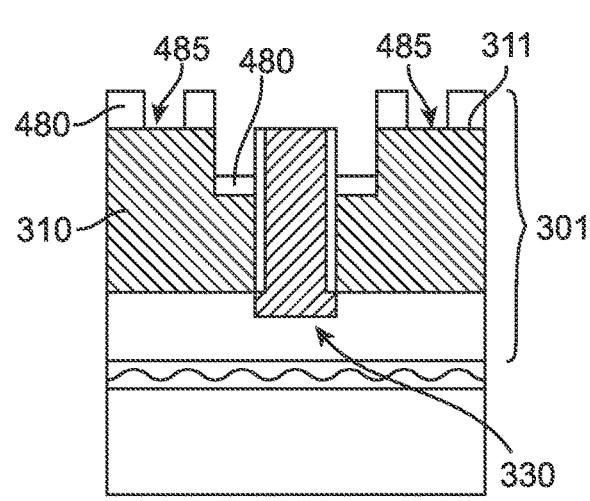

FIGS. 4C and 4D illustrate the semiconductor die 301 after a passivation material 480 has been deposited (FIG. 4C) and then patterned (FIG. 4D). The passivation material 480 is patterned to have openings 485 that expose areas the peripheral surface 311 of the semiconductor material 310 to a subsequent metal deposition.

Figure 4E:
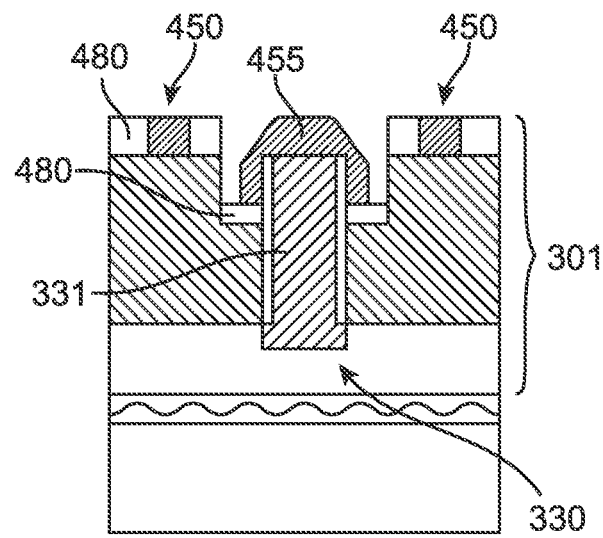
Figure 4F:
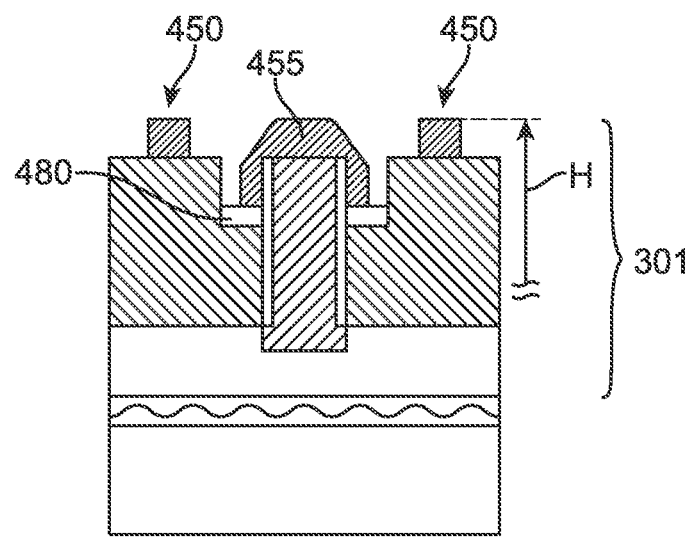

FIG. 4E illustrates the semiconductor die 301 after thermal pads 450 have been formed in the openings 485 (FIG. 4D) of the passivation material 480 and UBM structure 455 has been formed on the TSV 330. The thermal pads 450 and the UBM structure 455 can be formed concurrently such that they have approximately the same thickness. Since the exposed end of the TSV 330 (where the UBM structure 455 is formed) is generally coplanar with the peripheral surface 311 (where the thermal pads 450 are formed), the resulting vertical height of the UBM structure 455 and the thermal pads 450 can also be generally same, e.g., the UBM structure 455 and the thermal pads 450 can be at a generally same height (H). FIG. 4F illustrates the semiconductor die 301 after the passivation material around the thermal pads has been stripped away (e.g., by etching).

Figure 4G:
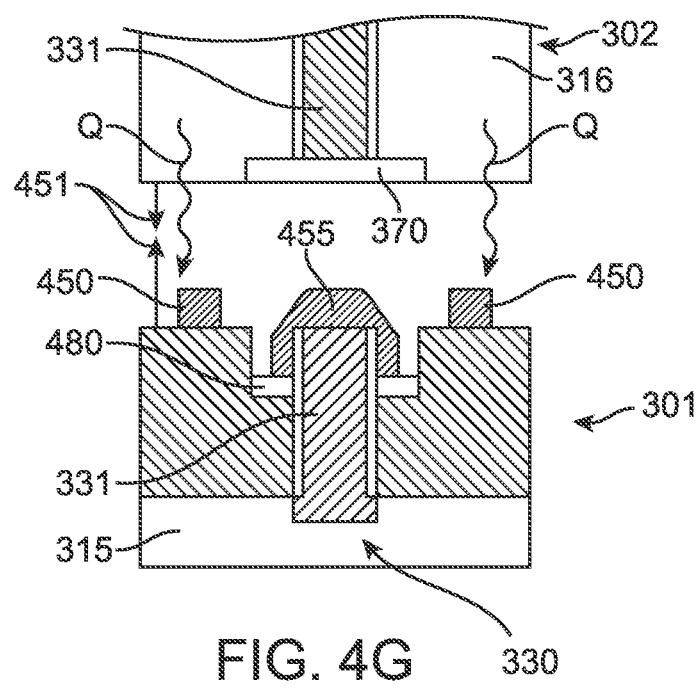

FIG. 4G illustrates stacking of the semiconductor dies 301 and 302 where the semiconductor die 301 is made as shown in FIGS. 4A-4F. The thermal pads 450 and the UBM structure 455 of the semiconductor die 301 can contact the semiconductor die 302 at the active structure 316 and the die pad 370, respectively, as indicated by arrows 451. A direct contact between the thermal pads 450 and the active structure 316 improves heat transfer (Q) between the dies 301 and 302 due to a relatively high thermal conductivity of the thermal pads 450 that are in direct contact with semiconductor dies. Additionally, since the top surfaces of the thermal pads 450 and UBM structure 455 are generally coplanar, the stacking yields of the semiconductor dies can be improved. The stacking process may be repeated for additional dies in the stack. However, in accordance with an embodiments of the present technology, only some dies in the stack may be directly contacted with the thermal pads 450, while others are not.

Figure 5:
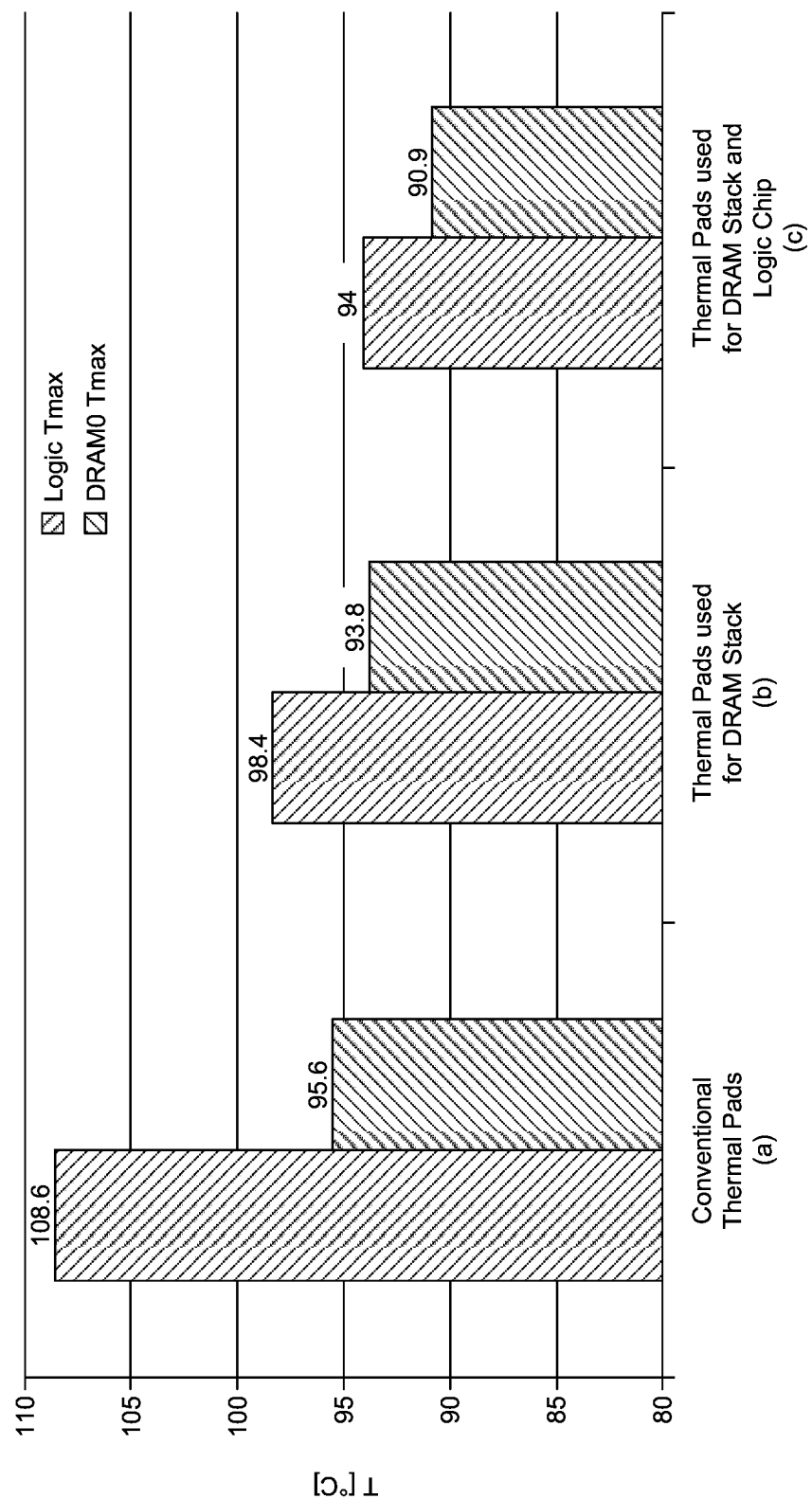
FIG. 5 is a comparison graph of die temperatures in conventional die stacks compared to embodiments of the present technology.

FIG. 5 is a comparison graph of die temperatures obtained by a numerical simulation of the conventional die stacks and die stacks in accordance with the present technology. Each simulation test case includes a semiconductor die stack having a logic semiconductor die and several memory dies. The horizontal axis includes three test cases: (a) a die stack having conventional thermal pad technology, (b) an embodiment of the present technology that includes thermal pads between the individual memory dies, and (c) an embodiment of the present technology that includes thermal pads between the individual memory dies and also between the logic die and the stack of the memory dies. The vertical axis indicates the maximum temperature simulated on the logic die and on the memory die that is next to the logic die. Power dissipation and general geometry/stacking arrangement of the semiconductor dies in the stack was same for all the simulated test cases (a, b, and c). With the conventional thermal pad (test case a), the temperatures simulated on the logic and memory dies were 108.6° C. and 95.6° C., respectively. When the thermal pads according to the present technology were used between the memory dies in the stack (test case b), the heat dissipation was improved and the temperatures simulated on the logic and memory dies were 98.4° C. and 93.8° C., respectively. Furthermore, when the thermal pads according to the present technology were used between all the dies in the stack (logic and memory, test case c), the heat dissipation from the stack was additionally improved and the temperatures simulated on the logic and memory dies were further lowered to 94° C. and 90.9° C., respectively. Therefore, the thermal pads according to the present technology produced lower temperature of the semiconductor dies in comparison to the conventional thermal pads in the same die stack.

From the foregoing, it will be appreciated that specific embodiments of the technology have been described herein for purposes of illustration, but that various modifications may be made without deviating from the disclosure. For example, materials of the thermal pads can differ from the materials of the UBM structures. Furthermore, the heights of the thermal pads and the UBM structures can be different if the structures of the next die in the stack have correspondingly adjusted heights. For example, a UBM structure that is higher than the thermal pads can be mated to a die pad that is recessed into an active surface of the next die by an appropriate depth, while still resulting in relatively good stacking yields. Moreover, while various advantages and features associated with certain embodiments have been described above in the context of those embodiments, other embodiments may also exhibit such advantages and/or features, and not all embodiments need necessarily exhibit such advantages and/or features to fall within the scope of the technology. Accordingly, the disclosure can encompass other embodiments not expressly shown or described herein.

We claim:

1. A semiconductor die, comprising:
   a semiconductor substrate having a first surface and a second surface angled relative to the first surface, wherein the second surface at least partially defines an opening in the first surface;
   an interconnect extending at least partially through the semiconductor substrate, wherein the interconnect includes an end portion projecting from the opening, and wherein the end portion has a sidewall exposed from the semiconductor substrate in the opening;
   a metallization structure extending at least partially around the sidewall of the end portion of the interconnect, wherein the metallization structure is laterally spaced apart from the second surface of the semiconductor substrate, and wherein the metallization structure is laterally spaced apart from the sidewall by a dielectric layer that surrounds the sidewall of the end portion of the interconnect; and
   a thermal pad on the first surface of the semiconductor substrate, wherein the thermal pad projects to a first vertical height above the first surface and the metallization structure projects to a second vertical height above the first surface, the first and second heights being generally the same.

2. The semiconductor die of claim 1, further comprising a passivation material at least partially on the first surface of the semiconductor substrate.

3. The semiconductor die of claim 1, further comprising a passivation material in the opening between the metallization structure and the semiconductor substrate.

4. The semiconductor die of claim 1, further comprising a passivation material in the opening on the second surface of the semiconductor substrate.

5. The semiconductor die of claim 4, wherein the passivation material on the second surface is laterally spaced apart from the metallization structure.

6. The semiconductor die of claim 1 wherein the metallization structure and the thermal pad include a common conductive material.

7. The semiconductor die of claim 1 wherein the metallization structure and the thermal pad each have an upper surface facing away from the first surface of the semiconductor substrate, and wherein the upper surfaces of the metallization structure and the thermal pad are generally coplanar.

8. The semiconductor die of claim 1 where the first surface is generally orthogonal to the second surface.

9. The semiconductor die of claim 1 wherein the opening contains a lateral open region between the metallization structure and the second surface.

10. The semiconductor die of claim 1 wherein the metallization structure does not extend below the sidewall of the end portion.

11. A semiconductor die, comprising:
    a semiconductor substrate having a surface and an indentation in the surface;
    an interconnect extending at least partially through the semiconductor substrate, wherein the interconnect includes an end portion projecting from the indentation, and wherein the end portion has a sidewall exposed from the semiconductor substrate in the indentation;
    a metallization structure extending at least partially around the sidewall of the end portion of the interconnect, wherein the metallization structure is laterally spaced apart from the sidewall by a dielectric layer that surrounds the sidewall of the end portion of the interconnect;
    a passivation material at least partially on the surface of the semiconductor substrate, wherein a first portion of the passivation material is in the indentation between the metallization structure and the semiconductor substrate, and wherein a second portion of the passivation material is in the indentation and laterally spaced apart from the metallization structure; and
    a thermal pad on the surface of the semiconductor substrate, wherein the thermal pad extends away from the surface to a first height and the metallization structure extends away from the surface to a second height, the first and second heights being generally the same.

12. The semiconductor die of claim 11 wherein the metallization structure and the thermal pad each have an upper surface facing away from the surface of the semiconductor substrate, and wherein the upper surfaces of the metallization structure and the thermal pad are generally coplanar.

13. The semiconductor die of claim 11 wherein the indentation contains a lateral open region between the second portion of the passivation material and the metallization structure.

14. The semiconductor die of claim 11 wherein the semiconductor substrate includes an inclined surface at least partially defining the indentation, and wherein the second portion of the passivation material is on the inclined surface.

15. The semiconductor die of claim 11 wherein the passivation material contacts the thermal pad.

16. The semiconductor die of claim 11 wherein the passivation material is a polyimide material, wherein the thermal pad has a side surface oriented generally perpendicular to the surface of the semiconductor substrate, and wherein the polyimide material extends at least partially along the side surface of the thermal pad.

17. The semiconductor die of claim 11 wherein the metallization structure and the thermal pad include a common conductive material.

18. The semiconductor die of claim 11 wherein the metallization structure does not extend below the sidewall of the end portion.

19. A semiconductor die, comprising:
- a semiconductor substrate having a generally horizontal surface and a generally vertical surface, wherein the vertical surface at least partially defines an indentation in the horizontal surface;
- an interconnect extending at least partially through the semiconductor substrate, wherein the interconnect includes an end portion projecting from the indentation, and wherein the end portion has a sidewall exposed from the semiconductor substrate in the indentation;
- a metallization structure extending at least partially around the sidewall of the end portion of the interconnect, wherein the metallization structure is laterally spaced apart from the vertical surface of the semiconductor substrate, and wherein the metallization structure is laterally spaced apart from the sidewall by a dielectric layer that surrounds the sidewall of the end portion of the interconnect; and
- a thermal pad on the horizontal surface of the semiconductor substrate, wherein the thermal pad extends away from the horizontal surface to a first height and the metallization structure extends away from the horizontal surface to a second height, the first and second heights being generally the same.

20. The semiconductor die of claim 19, further comprising a passivation material at least partially on the horizontal surface of the semiconductor substrate and in the indentation between the metallization structure and the semiconductor substrate.

21. The semiconductor die of claim 19 wherein the metallization structure and the thermal pad include a common conductive material.

22. The semiconductor die of claim 21 wherein the metallization structure and the thermal pad each have an upper surface facing away from the horizontal surface of the semiconductor substrate, and wherein the upper surfaces of the metallization structure and the thermal pad are generally coplanar.

23. The semiconductor die of claim 19 wherein the metallization structure does not extend below the sidewall of the end portion.

* * * * *